United States Patent
Gerna et al.

(10) Patent No.: US 9,970,979 B2
(45) Date of Patent: May 15, 2018

(54) MOS TRANSISTOR SATURATION REGION DETECTOR

(71) Applicant: Dialog Semiconductor (UK) Limited, Reading (GB)

(72) Inventors: Danilo Gerna, Leghorn (IT); Enrico Pardi, Cascina (IT); John Kesterson, Seaside, CA (US)

(73) Assignee: Dialog Semiconductor (UK) Limited, Reading (GB)

( * ) Notice: Subject to any disclaimer, the term of this patent is extended or adjusted under 35 U.S.C. 154(b) by 129 days.

(21) Appl. No.: 14/792,142

(22) Filed: Jul. 6, 2015

(65) Prior Publication Data
US 2017/0010316 A1    Jan. 12, 2017

(51) Int. Cl.
*G01R 31/02* (2006.01)
*G01R 31/26* (2014.01)
*G01R 1/30* (2006.01)

(52) U.S. Cl.
CPC ........... *G01R 31/2621* (2013.01); *G01R 1/30* (2013.01)

(58) Field of Classification Search
CPC .............. G01R 31/26; G01R 31/2621; G01R 31/2637; G01R 31/261; G01R 31/2831; G01R 31/025; G01R 31/327; G01R 31/04; G01R 1/30; G01R 19/15
USPC .... 324/762.08, 762.09, 762.01, 750.01, 500, 324/750.15, 555, 522
See application file for complete search history.

(56) References Cited

U.S. PATENT DOCUMENTS

| | | | | |
|---|---|---|---|---|
| 5,204,636 | A * | 4/1993 | Werner, Jr. | ............... H03F 1/52 330/253 |
| 6,661,249 | B2 * | 12/2003 | Oyrer | ...................... G05F 3/262 324/762.09 |
| 7,397,265 | B2 | 7/2008 | Taketoshi et al. | |
| 7,605,598 | B2 * | 10/2009 | Kelly | ............... G01R 19/16571 324/762.01 |

(Continued)

FOREIGN PATENT DOCUMENTS

| DE | 69611981 | 10/2001 |
|---|---|---|
| DE | 10229460 | 1/2004 |

OTHER PUBLICATIONS

German Office Action and English Language Translation, File No. 10 2015 217 757.2, Applicant: Dialog Semiconductor (UK) Limited, dated Mar. 21, 2016, 10 pgs.

*Primary Examiner* — Thang Le
(74) *Attorney, Agent, or Firm* — Saile Ackerman LLC; Stephen B. Ackerman (57) ABSTRACT

This application relates to a circuit for determining whether a first transistor device is in a predetermined operation mode. The circuit comprises: a second transistor device, wherein control terminals of the first and second transistor devices are connected, and one of input and output terminals of the first transistor device is connected to the other one of input and output terminals of the second transistor device, a buffer amplifier connected between the one of input and output terminals of the first transistor device and the other one of input and output terminals of the second transistor device, and circuitry for determining whether the first transistor device is in the predetermined operation mode based on an indication of a current flowing through the second transistor device. The application further relates to a method of determining whether a first transistor device is in a predetermined operation mode.

12 Claims, 7 Drawing Sheets

(56) References Cited

U.S. PATENT DOCUMENTS

| | | | |
|---|---|---|---|
| 9,360,879 B2* | 6/2016 | Levhar | G05F 3/02 |
| 2007/0216439 A1* | 9/2007 | Taketoshi | G01R 31/2621 |
| | | | 324/762.09 |
| 2012/0092055 A1* | 4/2012 | Peschke | H03F 3/72 |
| | | | 327/306 |
| 2014/0062435 A1* | 3/2014 | Lu | H02J 7/0072 |
| | | | 323/282 |
| 2014/0347119 A1* | 11/2014 | Vacca Cavalotto | G01R 19/0092 |
| | | | 327/434 |
| 2015/0145562 A1* | 5/2015 | Vermeir | H05K 13/00 |
| | | | 327/87 |
| 2015/0220096 A1* | 8/2015 | Luff | G02F 1/1368 |
| | | | 327/109 |

* cited by examiner

MOS TRANSISTOR SATURATION REGION DETECTOR

TECHNICAL FIELD

This application relates to a circuit and method for determining whether a transistor device is in a predetermined operation mode. The application particularly relates to such circuit and method that allow to determine whether the transistor device operates in saturation mode.

BACKGROUND

In complex integrated circuits (ICs) there may arise the need to know whether a particular block of the circuit has correctly started up or to check in which operation condition the block is currently working. For example, in some cases it may be useful to know whether or not a linear amplifier is in a condition where it has enough DC gain.

Namely, an IC in general is able to perform several different functions, and the choice of how the IC has to react to external stimuli may depend on surrounding conditions of the IC. In case of transient conditions, it might occur that the IC is not in the appropriate operation condition to react to an external stimulus. In such cases, it is important to have univocal knowledge of whether or not the IC works in the correct operating condition.

Figure 11:
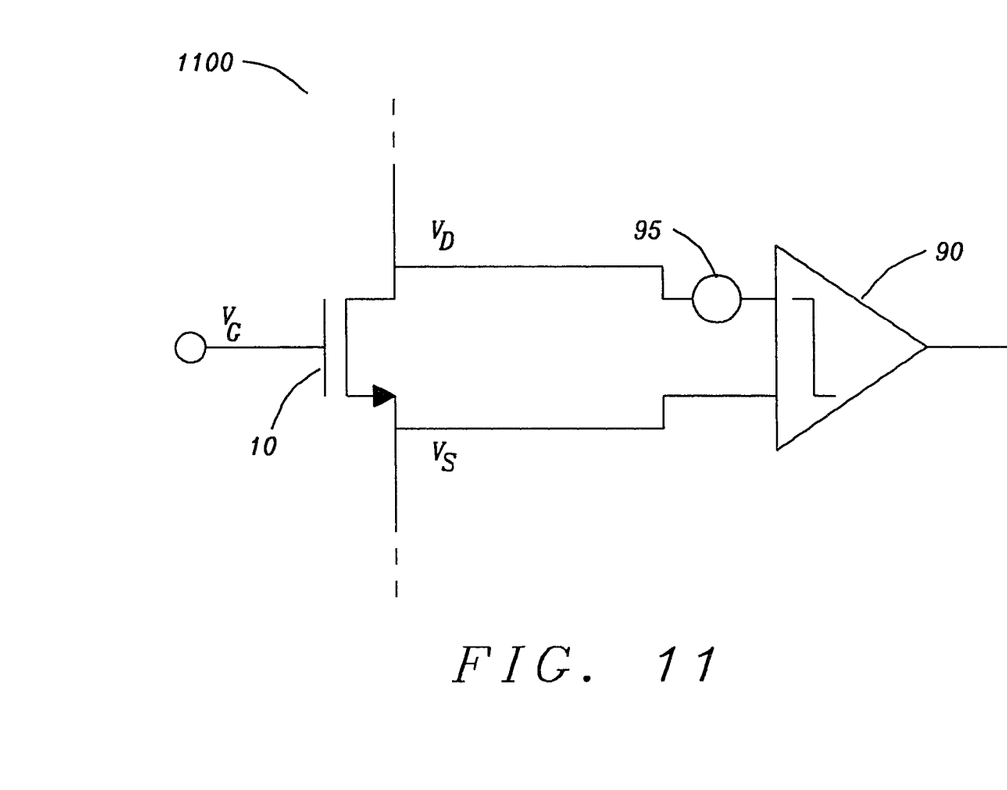
FIG. 11 schematically illustrates a circuit including a comparator with variable intrinsic offset for determining whether a transistor device is in saturation mode.

One way to detect whether the IC works in the correct operating condition is to check whether or not sensitive Metal-Oxide-Semiconductor (MOS) transistors of the IC work in their saturation region. FIG. 11 illustrates a circuit 1100 for detecting whether an n-channel MOS (NMOS) transistor 10 is in saturation. In general, a MOS transistor is in saturation when the difference between the voltage at its drain terminal, $V_D$, and the voltage at its source terminal, $V_S$, is larger than the difference between the gate-source voltage of the MOS transistor, $V_{GS}$, and the threshold voltage of the MOS transistor, $V_{TH}$, i.e. when $V_D - V_S > V_{GS} - V_{TH}$. The circuit 1100 comprises a comparator 90 with an intrinsic offset that matches the voltage $V_{GS} - V_{TH}$ of the MOS transistor. The intrinsic offset of the comparator 90 may be generated by means of a voltage source 95 that outputs a voltage of $V_G - V_{TH}$. If the saturation condition is satisfied, the comparator 90 will flag this by outputting a logical "1", otherwise the comparator will output a logical "0".

However, this approach has the disadvantage that the intrinsic offset of the comparator 90 has to match the variation of the voltage $V_{GS} - V_{TH}$ over corners of the operation range of the MOS transistor and also has to account for temperature variation.

Further approaches of detecting an operation state of a MOS transistor may have the disadvantage that they may impact operation of the MOS transistor in linear region.

Thus, there is a need for an improved circuit for determining whether a transistor device is in a predetermined operation mode, and for an improved method of determining whether a transistor device is in a predetermined operation mode.

SUMMARY

In view of this need, the present document proposes a circuit for determining whether a transistor device is in a predetermined operation mode and a method of determining whether a transistor device is in a predetermined operation mode, having the features of the respective independent claims.

An aspect of the disclosure relates to a circuit for determining (detecting) whether a first transistor device (pass device) is in a predetermined operation region (operation mode). The predetermined operation mode may be the saturation mode (also referred to as active mode). In saturation mode, one may have $V_D - V_S > V_{GS} - V_{TH}$. The first transistor device may be a MOS transistor, e.g. a MOS Field Effect Transistor (MOSFET), such as a p-channel MOS transistor (PMOS) or an NMOS. The circuit may comprise a second transistor device (detecting device). The second transistor device may be a MOS transistor, e.g. a MOSFET, such as a PMOS or an NMOS. The second transistor device may be a scaled replica of the first transistor device. Control terminals (e.g. gate terminals) of the first and second transistor devices may be connected. One of input and output terminals (e.g. source and drain terminals) of the first transistor device may be connected to the other one of input and output terminals (e.g. source and drain terminals) of the second transistor device. In other words, one of input terminals or one of output terminals of the first transistor device is connected to the other one of input terminals or one of output terminals of the second transistor device. For example, an input terminal of the first transistor device is connected to an output terminal of the second transistor device, or alternatively, an output terminal of the first transistor device is connected to an input terminal of the second transistor device.

The drain terminal of the first transistor device may be connected to the source terminal of the second transistor device. The circuit may further comprise a buffer (buffer amplifier) connected between the one of input and output terminals of the first transistor device and the other one of input and output terminals of the second transistor device. The buffer amplifier may have substantially infinite (i.e. very large) impedance at its input port facing the one of input and output terminals of the first transistor device. Accordingly, the buffer amplifier may serve to decouple the first transistor device and the second transistor device in a sense that there is substantially no current flowing from the one of input and output terminals of the first transistor device to the other one of input and output terminals of the second transistor device. The circuit may further comprise circuitry (current detection circuitry) for determining whether the first transistor device is in the predetermined operation mode based on an indication of a current flowing through the second transistor device.

Configured as above, when the first transistor device is in saturation, there will be no current flowing through the second transistor device, which will be detected by the current detection circuitry. Accordingly, the circuit is capable of detecting whether the first transistor device is in the predetermined operation mode throughout the full operation range of the first transistor device. Contrary to the example of FIG. 11, this does not require tuning a voltage offset $V_{GS} - V_{TH}$.

Moreover, the buffer amplifier of the circuit according to this aspect substantially blocks a current from flowing from said one of input and output terminals of the first transistor device to said other one of input and output terminals of the second transistor device. Accordingly, when the first transistor device is in the linear region (also referred to as ohmic region, or triode region), operation of the first transistor device is not perturbed by the circuit, and correct operation of the first transistor device in the linear region (e.g. during startup of an IC comprising the first transistor device) is ensured.

In embodiments, the buffer amplifier may comprise an operational amplifier with its output port connected to its negative (inverting) input port. In other words, the buffer amplifier may be an operational amplifier in buffer configuration (voltage follower configuration, or impedance converter configuration). Thereby, the buffer amplifier can be implemented in a simple and efficient manner, and at low power consumption.

In embodiments, the circuit may further comprise a voltage source connected between the one of input and output terminals of the first transistor device and the buffer amplifier. The voltage source may be a controllable (programmable) voltage source. The voltage source may generate an offset voltage. The offset voltage may be chosen such that the output voltage of the buffer amplifier is lower than the input voltage to the buffer amplifier (i.e. lower than the voltage at the one of input and output terminals of the first transistor device). Thereby, headroom for determination of whether the first transistor device is in saturation can be provided for. In other words, it can be ensured that the first transistor device is only determined to be in saturation when it is in deep saturation. Accordingly, the circuit is less sensitive to statistical mismatch and is less likely to erroneously flag the first transistor device as operating in the saturation region.

In embodiments, the current detection circuitry may be adapted to compare said current flowing through the second transistor device to a reference current. To this end, the current detection circuitry may comprise a current source for generating the reference current connected in series with the second transistor device, and an inverter connected to an intermediate node between the second transistor device and the current source. The current source may be a controllable (programmable) current source. Said determining whether the first transistor device is in the predetermined operation mode by the current detection circuitry may be based on an output of the inverter. Alternatively, the current detection circuitry may comprises a resistance element connected in series with the second transistor device, and an inverter connected to an intermediate node between the second transistor device and the resistance element. The resistance of the resistance element may be chosen such that the current flowing through the resistance element corresponds to the reference current. The resistance element may comprise a variable resistor. Said determining whether the first transistor device is in the predetermined operation mode by the current detection circuitry may be based on an output of the inverter. Accordingly, whether or not the first transistor device is in the predetermined operation mode (e.g. the saturation region) can be determined in a simple and reliable manner.

Another aspect of the disclosure relates to a method of determining whether a first transistor device (pass device) is in a predetermined operation region (operation mode). The predetermined operation mode may be the saturation mode (also referred to as active mode). In saturation mode, one may have $V_D - V_S > V_{GS} - V_{TH}$. The first transistor device may be a MOS transistor, e.g. a MOSFET, such as a PMOS or an NMOS. The method may comprise sensing (e.g. tapping) a voltage at one of input and output terminals (e.g. source and drain terminals) of the first transistor device. The method may further comprise supplying said sensed voltage to a buffer amplifier. The buffer amplifier may have substantially infinite (i.e. very large) impedance at its input port facing the one of input and output terminals of the first transistor device. The method may further comprise supplying an output of the buffer amplifier to the other one of input and output terminals (e.g. source and drain terminals) of a second transistor device (detecting device). The second transistor device may be a MOS transistor, e.g. a MOSFET, such as a PMOS or an NMOS. The second transistor device may be a scaled replica of the first transistor device. The second transistor device may be connected in series to the first transistor device. Control terminals (e.g. gate terminals) of the first and second transistor devices may be connected. The method may further comprise determining whether the first transistor device is in the predetermined operation mode based on an indication of a current flowing through the second transistor device.

In embodiments, said sensed voltage may be sensed at the drain terminal of the first transistor device. Further, said sensed voltage may be supplied to the source terminal of the second transistor device.

In embodiments, the buffer amplifier may comprise an operational amplifier with its output port connected to its negative (inverting) input port. In other words, the buffer amplifier may be an operational amplifier in buffer configuration (voltage follower configuration, or impedance converter configuration).

In embodiments, the method may further comprise adding an offset voltage to said sensed voltage. This may be achieved using a voltage source connected between the one of input and output terminals of the first transistor device and the buffer amplifier. The voltage source may be a controllable (programmable) voltage source.

The voltage source may generate an offset voltage. The offset voltage may be chosen such that the output voltage of the buffer amplifier is lower than the input voltage to the buffer amplifier (i.e. lower than the voltage at the one of input and output terminals of the first transistor device).

In embodiments, said determining may involve comparing said current flowing through the second transistor device to a reference current. Said determining may further involve deciding that the first transistor device is in saturation if said current is smaller than the reference current. This may be achieved by a current source for generating the reference current connected in series with the second transistor device and an inverter connected to an intermediate node between the second transistor device and the current source. The current source may be a controllable (programmable) current source. Said determining whether the first transistor device is in the predetermined operation mode may be based on an output of the inverter. Further, the same may be achieved by a resistance element connected in series with the second transistor device and an inverter connected to an intermediate node between the second transistor device and the resistance element. The resistance of the resistance element may be chosen such that the current flowing through the resistance element corresponds to the reference current. The resistance element may comprise a variable resistor. Said determining whether the first transistor device is in the predetermined operation mode may be based on an output of the inverter.

It will be appreciated that method steps and apparatus features may be interchanged in many ways. In particular, the details of the disclosed method can be implemented as an apparatus adapted to execute some or all or the steps of the method, and vice versa, as the skilled person will appreciate.

BRIEF DESCRIPTION OF THE FIGURES

Embodiments of the disclosure are explained below in an exemplary manner with reference to the accompanying drawings, wherein FIG. 1 and FIG. 2 schematically illustrate examples of circuits for detecting whether a transistor device is in saturation mode according to embodiments of the disclosure.

DETAILED DESCRIPTION

Figure 1:
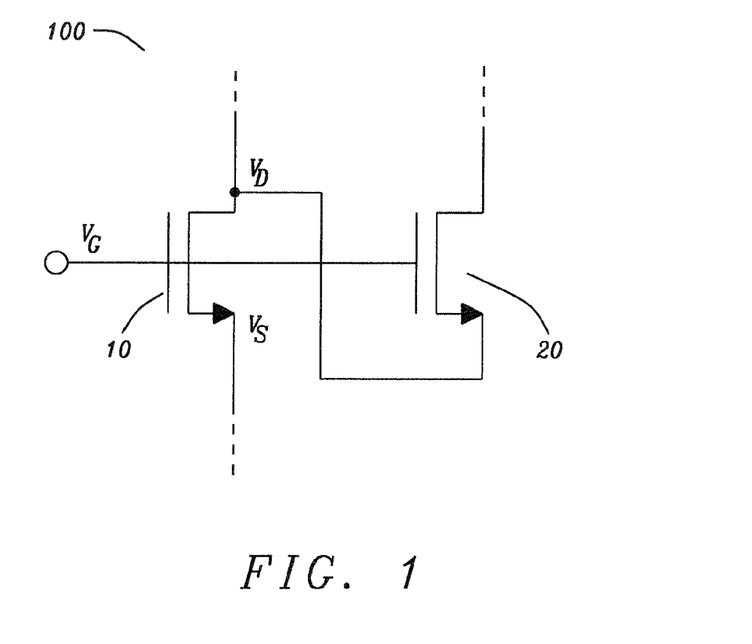

FIG. 1 schematically illustrates an example of a circuit 100 (topology) for determining (detecting) whether a first transistor device 10 (Device under Test, DUT) is in the saturation region (i.e. operates in saturation mode). Such circuit may be referred to as a saturation detector. The circuit 100 may comprise a second transistor device 20 (detecting device). The second transistor device 20 may be a scaled replica of the first transistor device 10. Both the first and second transistor devices 10, 20 may be MOS transistors. In the example of FIG. 1, both the first and second transistor devices 10, 20 may be NMOS transistors. Control terminals (e.g. gate terminals) of the first and second transistor devices 10, 20 may be connected to each other. Moreover, one of input and output terminals of the first transistor device 10 (e.g. the drain terminal) may be connected to the other one of input and output terminals (e.g. the source terminal) of the second transistor device 20. Here, the terms input and output terminals are used to indicate the source and drain terminals of MOS transistors, for example.

In this configuration, there is no current flowing through the second transistor device 20 when the first transistor device 10 is in saturation. Namely, at the threshold to the saturation region, we have, for the first transistor device 10, $V_D = V_{GS} - V_{TH} + V_S$. Accordingly, for the second transistor device 20 we have (primed quantities referring to the second transistor device 20) $V'_S = V_D$, so that $V'_{GS} = V_{TH}$. For increasing $V_D$ at the first transistor device 10, $V'_{GS}$ at the second transistor device 20 will drop below the threshold voltage $V_{TH}$ and the second transistor device 20 will be choked. The absence of a source-drain current in the second transistor device 20 (i.e. a current flowing through the second transistor device 20) may be detected, and it may be decided accordingly that the first transistor device 10 is in saturation.

If the second transistor device 20 is sized correctly, it turns on when the first transistor device 10 operates in the linear region. In this case, part of the current that would otherwise have flown through the first transistor device 10 now flows through the second transistor device 20 instead. Using a current detector on the second transistor device 20, saturation of the first transistor device can thus easily be detected: If a current flows through the second transistor device 20, the first transistor device 10 may be decided to be in the linear region. Otherwise, if there is no current flowing through the second transistor device 20, the first transistor device 10 may be decided to be in the saturation region. The benefit of this idea is that, if sized correctly, the second transistor device 20 naturally tracks the first transistor device 10 over the corners of its operation range.

As indicated above, the second transistor device 20 in principle could be the same size as the first transistor device 10. Depending on the required precision and sensitivity, the second transistor device 20 may be either a fraction or multiple (not integer) of the first transistor device 10.

Figure 2:
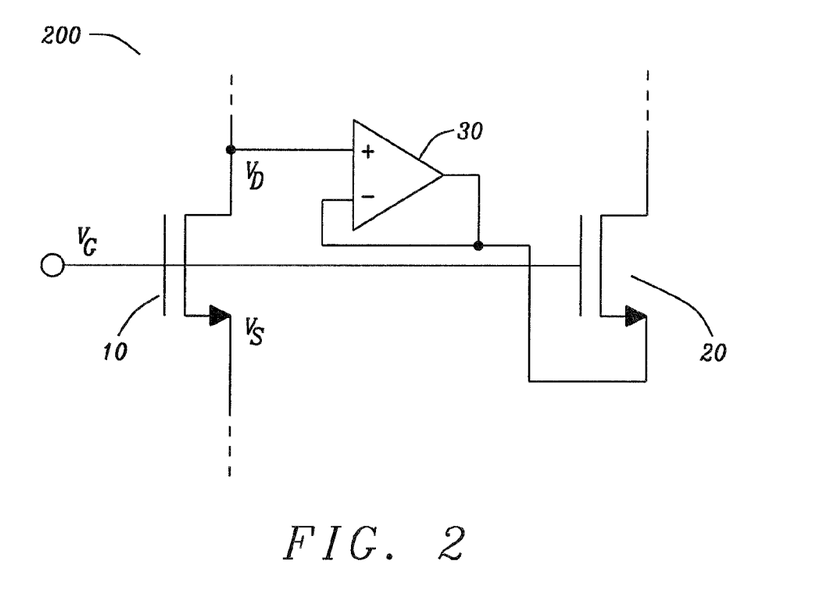

FIG. 2 schematically illustrates another example of a circuit 200 for determining whether a first transistor device 10 is in the saturation region. Unless indicated otherwise, statements made with respect to the circuit 100 of FIG. 1 and reference numbers apply also here.

The circuit 200 may comprise, in addition to the second transistor device 20, a buffer (buffer amplifier) 30 connected between the one of input terminals of the first transistor device 10 and the other one of input terminals of the second transistor device 20, e.g. between the drain terminal of the first transistor device 10 and the source terminal of the second transistor device 20.

The buffer amplifier 30 may be an Operational Transconductance Amplifier (OTA). The buffer amplifier 30 may comprise an operational amplifier in buffer configuration (i.e. in voltage follower configuration, or impedance converter configuration). Accordingly, the output port of the operational amplifier may be connected to its negative (inverting) input port, i.e. the buffer amplifier 30 may comprise a feedback loop connecting the output terminal of the operational amplifier to the negative (inverting) input port of the operational amplifier. In this configuration, the buffer amplifier 30 (including the operational amplifier and the feedback loop) may have unity gain, i.e. 0 dB gain. Further, a voltage at the output port of the operational amplifier follows the voltage at the positive (non-inverting) input port. Yet further, in this configuration said positive input port may have a very large (in principle, infinite) impedance. Said positive input port may be connected to said one of input and output terminals (e.g. the drain terminal) of the first transistor device 10.

The buffer amplifier 30 may provide an extra current to the second transistor device 20 which can be used for detecting saturation of the first transistor device 10 (more precisely, for detecting that the first transistor device 10 is not in saturation). Providing this current to the second transistor device 20 is achieved without interfering with the operation of the first transistor device 10 when the first transistor device 10 operates in the linear region. In other words, the second transistor device 20 does not perturb the natural behavior of the first transistor device 10 when the first transistor device 10 is in the linear region. Thus, the buffer amplifier 30 may be said to decouple the first transistor device 10 and the second transistor device 20.

The circuit 200 may further comprise circuitry for determining whether the first transistor device 10 is in the saturation region (current detection circuitry; not shown in FIG. 2) based on a current flowing through the second transistor device 20. The current detection circuitry may be adapted to sense said current. Further, the current detection circuitry may be adapted to compare said current to a reference current. Examples of possible implementations of the current detection circuitry will be described below with reference to FIG. 7 and FIG. 8. Here it shall suffice to say that the current detection circuitry may determine that the first transistor device 10 is in the saturation region if there is (substantially) no current flowing through the second transistor device 20, or if a current that is less than a lower threshold (e.g. implemented by the reference current) is flowing through the second transistor device 20. There is not a specific lower threshold for the current flowing through the second transistor device 20 for deciding, upon said current dropping below said lower threshold, that the first transistor device 10 is in saturation. Accordingly, said lower threshold may be chosen in accordance with specific requirements.

Notably, there is no need for either a high current output or high precision of the operational amplifier forming the buffer amplifier 30 in the circuit 200. Also speed of the operational amplifier is not a stringent requirement. For these reasons, the buffer amplifier 30 can be designed in a simple manner and may be implemented with low power consumption.

As mentioned above, one of the advantages of embodiments of the disclosure is that the saturation detector does not perturb the first transistor device 10 when the first transistor device 10 it is not in saturation. This applies independently of the bias configuration of the first transistor device 10.

Figure 4:
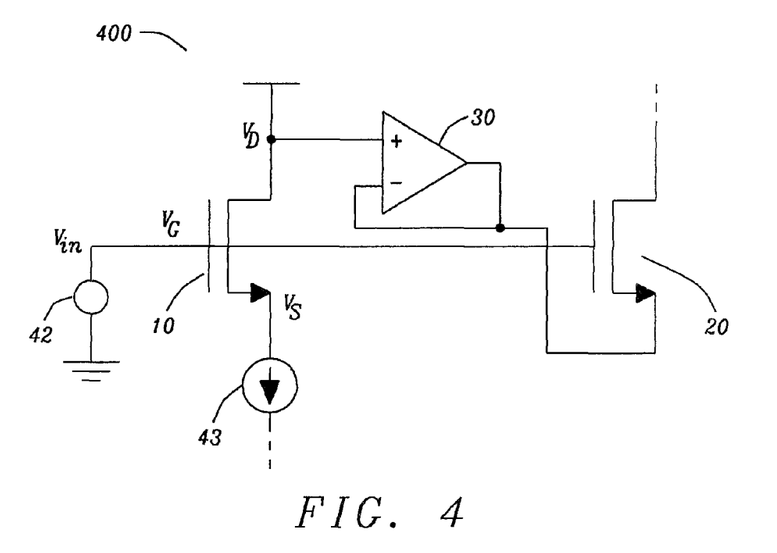
FIG. 4 to FIG. 6 schematically illustrate different configurations of the transistor device according to embodiments of the disclosure.
Figure 5:
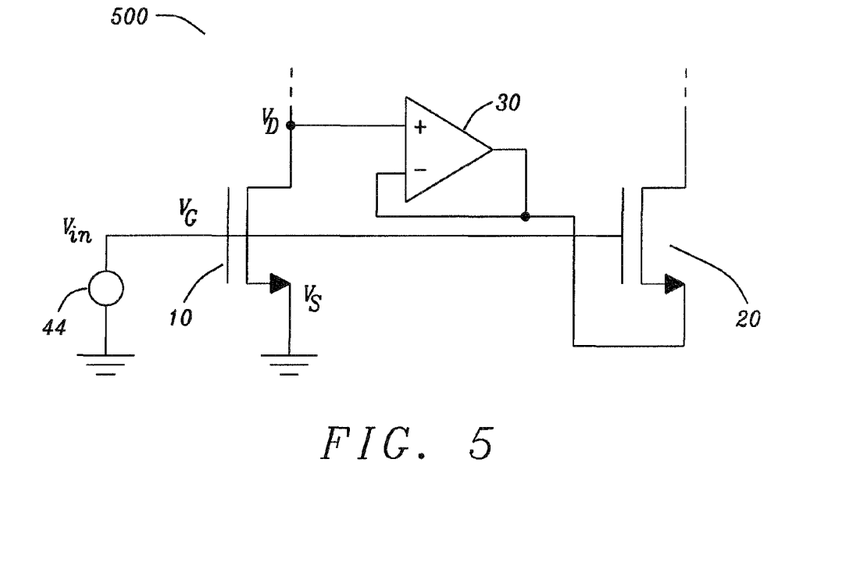
Figure 6:
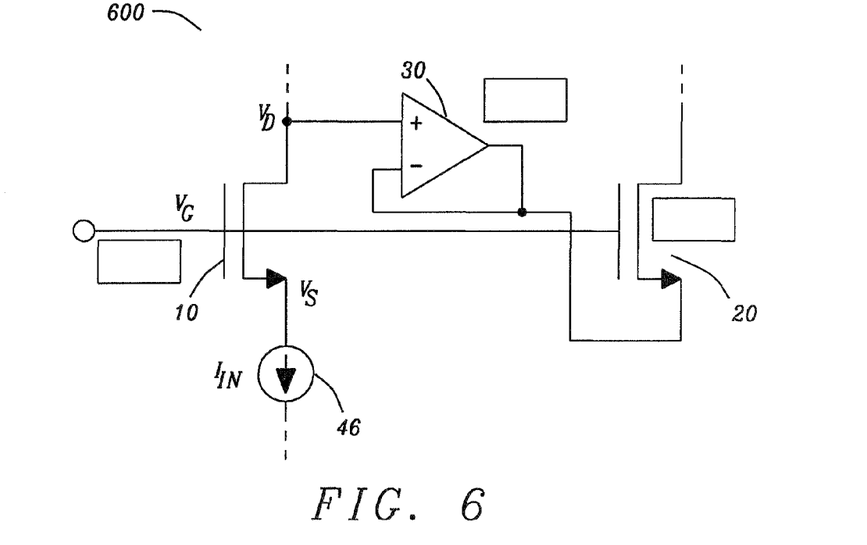

FIG. 4 to FIG. 6 schematically illustrate possible bias configurations of the first transistor device 10 to which circuits (saturation detectors) according to embodiments of the disclosure may be applied. FIG. 4 illustrates a circuit 400 for the case of the first transistor device 10 in the common drain configuration in which the drain terminal of the first transistor device 10 may be connected to the supply voltage $V_{DD}$ and the gate terminal may be connected to a predetermined voltage level e.g. generated by a voltage source 42. The source terminal of the first transistor device 10 may be connected to a current source 43. FIG. 5 illustrates a circuit 500 for the case of the first transistor device 10 in the common source configuration in which the source terminal of the first transistor device 10 may be connected to ground and the gate terminal may be connected to a predetermined voltage level e.g. generated by a voltage source 44. FIG. 6 illustrates a circuit 600 for the case of the first transistor device 10 in the common gate configuration, in which the gate terminal of the first transistor device 10 may be connected to an external port. The source terminal of the first transistor device 10 may be connected to a current source 46.

As indicated above, the circuit for determining whether the first transistor device 10 is in the saturation region may comprise circuitry (current detection circuitry; not shown in FIG. 2) for determining whether the first transistor device 10 is in the saturation region based on a current flowing through the second transistor device 20. Examples of possible implementations of the current detection circuitry will now be described with reference to FIG. 7 and FIG. 8. Notably, the current detection circuitry described below may be applied to any of the circuits (saturation detectors) described throughout the present disclosure.

Figure 7:
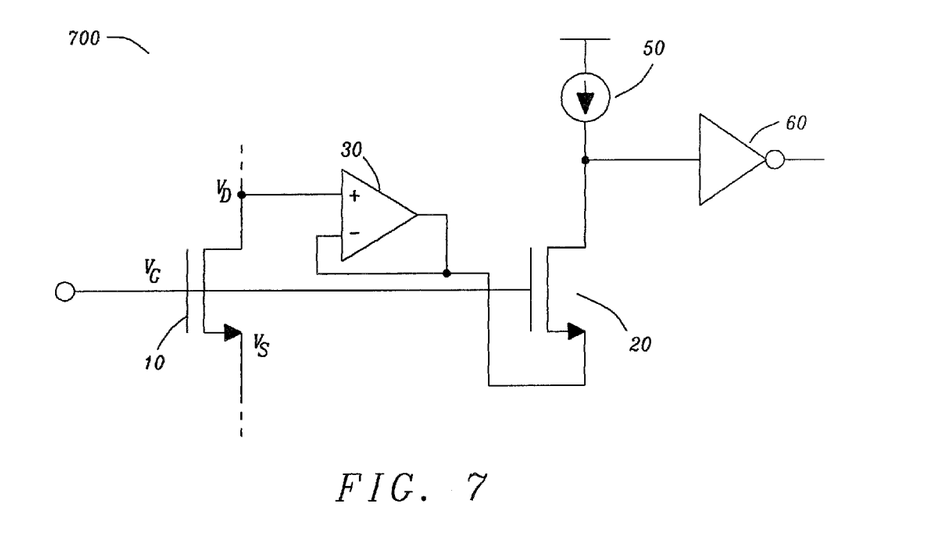
FIG. 7 and FIG. 8 schematically illustrate examples of implementation of a circuit for detecting whether a transistor device is in saturation mode according to embodiments of the disclosure.

In FIG. 7, the circuit 700 for determining whether the first transistor device 10 is in saturation may comprise, in addition to the second transistor device 20 and the buffer amplifier 30 described above, also a current source 50 connected in series with the second transistor device 20, and an inverter 60. The current source 50 and the inverter 60 may be said to form the current detection circuitry. An input port of the inverter 60 may be connected to an intermediate node between the (drain terminal of) the second transistor device 20 and the current source 50. The current source 50 may be a controllable (programmable) current source. The current source may generate (i.e. source or pull) a reference current. The current flowing into the inverter 60 may be given by the sum of the current flowing from the current source 50 to said intermediate node, and the current flowing from the second transistor device 20 to said intermediate node. Accordingly, for appropriate polarity of the current generated by the current source 50, the current flowing through the second transistor device 20 may be compared to the reference current. For example, as long the current I(MD) flowing through the second transistor device 20 higher (larger) than the reference current, the output of the inverter 60 will flag the logical value "1" indicating that the first transistor device 10 is in the linear region. Otherwise, it the current $I(M_D)$ that flows through the second transistor device 20 is less than the reference current, drain terminal of the second transistor device 20 is tied to the positive voltage and the output of the inverter 60 will flag the logical value "0" indicating that the first transistor device 10 operates in the saturation region.

Figure 8:
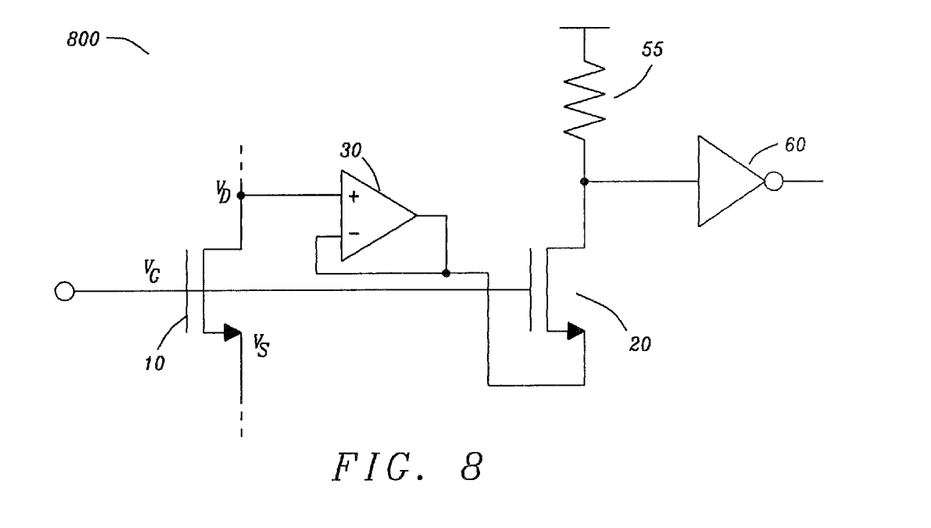

In FIG. 8, the circuit 800 for determining whether the first transistor device 10 is in saturation may comprise, in addition to the second transistor device 20 and the buffer amplifier 30 described above, also a resistance element (e.g. resistor) 55 connected in series with the second transistor device 20, and an inverter 60. The resistance element 55 and the inverter 60 may be said to form the current detection circuitry. An input port of the inverter 60 may be connected to an intermediate node between the (drain terminal of) the second transistor device 20 and the resistance element 55. The resistance value of the resistance element 55 may be chosen such that the current flowing through the resistance element 55 equals a desired reference current. To this end, the resistance element 55 may comprise a variable resistor. The current flowing into the inverter 60 may be given by the sum of the current flowing through the resistance element 55 towards said intermediate node, and the current flowing from the second transistor device 20 to said intermediate node. Depending on the current flowing through the second transistor device 20, the voltage across the resistance element 55 will be close to the positive voltage (for low current) or close to the drain voltage of the second transistor device 20 (for high current). Thus, broadly speaking, in the circuit 800 of FIG. 8, the current flowing through the second transistor device 20 may be said to be measured by letting it flow through the resistance element 55. The logical values of the inverter 60 may flag the same saturation conditions as indicated above with reference to FIG. 7.

In both circuits 700 and 800 described above, determining whether the first transistor device 10 is in saturation (or not in saturation) may be based on an output of the inverter 60.

As a possible improvement to the circuits (saturation detectors) described above, the buffer amplifier 30 may be designed with a (programmable) offset. This offset may be set such that the output voltage of the buffer amplifier 30 is lower than the voltage $V_D$ at the drain terminal of the first transistor device 10. Then, the saturation detector would only flag the first transistor device 10 as being in saturation when the first transistor device 10 is out of the linear region by a certain headroom. The advantage of using the saturation detector in this way is that it is less sensitive to statistical mismatch and it flags out only when the first transistor device 10 is in deep saturation. As indicated above, the offset might be either permanent or programmable.

Figure 9:
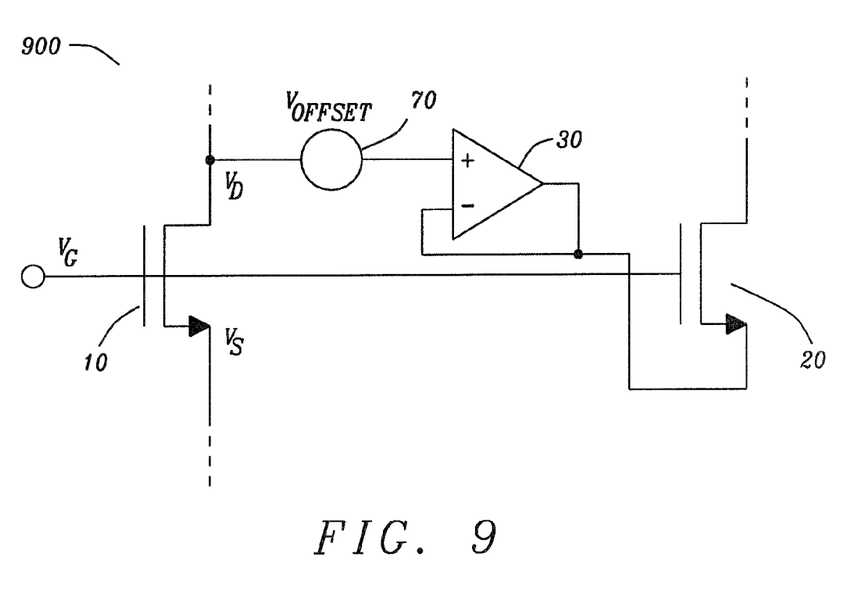
FIG. 9 schematically illustrates another example of implementation of a circuit for detecting whether a transistor device is in saturation mode according to embodiments of the disclosure.

FIG. 9 schematically illustrates another example of a circuit 900 for determining whether a first transistor device 10 is in the saturation region, in which the buffer amplifier 30 is designed with an offset. Unless indicated otherwise, statements made with respect to the circuits (saturation detectors) described above apply also here. The circuit 900 may be referred to as saturation detector topology with programmable offset.

The circuit 900 may comprise, in addition to the second transistor device 20 and the buffer amplifier 30 described above, a voltage source 70 connected between the one of input and output terminals (e.g. the drain terminal) of the first transistor device 10 and the buffer amplifier 30. More specifically, the voltage source 70 may be connected between the one of input and output terminals (e.g. the drain terminal) of the first transistor device 10 and the positive (non-inverting) input port of the operational amplifier forming the buffer amplifier 30. The voltage source 70 may be a controllable (programmable) voltage source. The voltage source 70 may generate the offset for the buffer amplifier 30 by generating an offset voltage $V_{OFFSET}$.

As indicated earlier, the buffer amplifier 30 does not have to be expressly an OTA as shown e.g. in FIG. 9, but it may be any amplifier that has an approximate gain of 0 dB and has a voltage shifter (both positive and negative).

Figure 3:
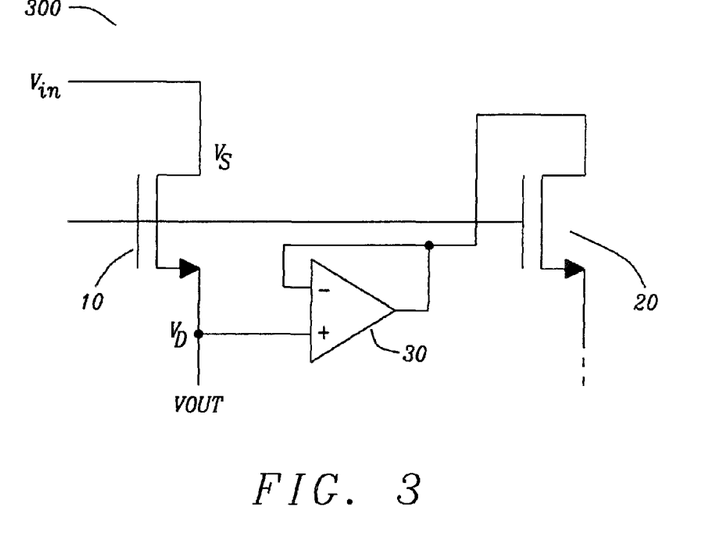
FIG. 3 schematically illustrates another example of a circuit for detecting whether a transistor device is in saturation mode according to embodiments of the disclosure.

While the figures described above illustrate circuits (saturation detectors) for determining whether an NMOS is in the saturation region, the embodiments of the present disclosure are equally applicable to determining whether a PMOS (e.g. a PMOS in the output stage of a Low-Dropout regulator, LDO) is in the saturation region. For example, FIG. 3 schematically illustrates an example of a circuit 300 for determining whether a first transistor device 10, which is a PMOS, is in the saturation region. The circuit 300 of FIG. 3 represents the counterpart to the circuit 200 of FIG. 2. The circuit 300 may comprise a second transistor device 20, which is also a PMOS, and a buffer amplifier 30. As regards the configuration and arrangement of the first transistor device 10, the second transistor device 20, and the buffer amplifier 30 in the circuit 300, statements corresponding to those made above in connection with FIG. 1 and FIG. 2 apply.

As indicated above, the circuit 300 of FIG. 3 may be applied to a pass device (output transistor) of an LDO. For example, the circuit 300 could flag out when the output transistor is in the linear region, thereby providing additional information about the status of the LDO.

In general, counterpart circuits to the circuits of FIG. 2 and FIG. 4 to FIG. 10, which exemplarily relate to the case of the first transistor device 10 being implemented by an NMOS, may be derived in a straightforward manner, by substituting NMOS and PMOS transistors, by substituting the voltage levels $V_{DD}$ (supply voltage) and $V_{SS}$ (ground), and, if applicable, by substituting logical "0" and "1" levels, as the skilled person will appreciate. In other words, the embodiments of the disclosure are equally applicable to PMOS and NMOS transistors.

A possible application example for circuits (saturation detectors) according to embodiments of the disclosure will be described next with reference to FIG. 10, in which a circuit (saturation detector) according to embodiments of the disclosure is applied to a cascode-based current source. The cascode-based current source may comprise first to fourth cascode devices (transistors) 10, 81, 82, 83, of which the first cascode device 10 may correspond to the first transistor device, i.e. to the DUT of a circuit (saturation detector) 1000. The first and second cascade devices 10, 81 may be connected in series, and the third and fourth cascode devices 82, 83 may be connected in series. Control terminals of the first and third and of the second and fourth cascode devices 10, 82, 81, 83 may be respectively connected. The cascode-based current source may further comprise a current source 84 and a resistor 85 connected in series with the third and fourth cascode devices 82, 83.

Figure 10:
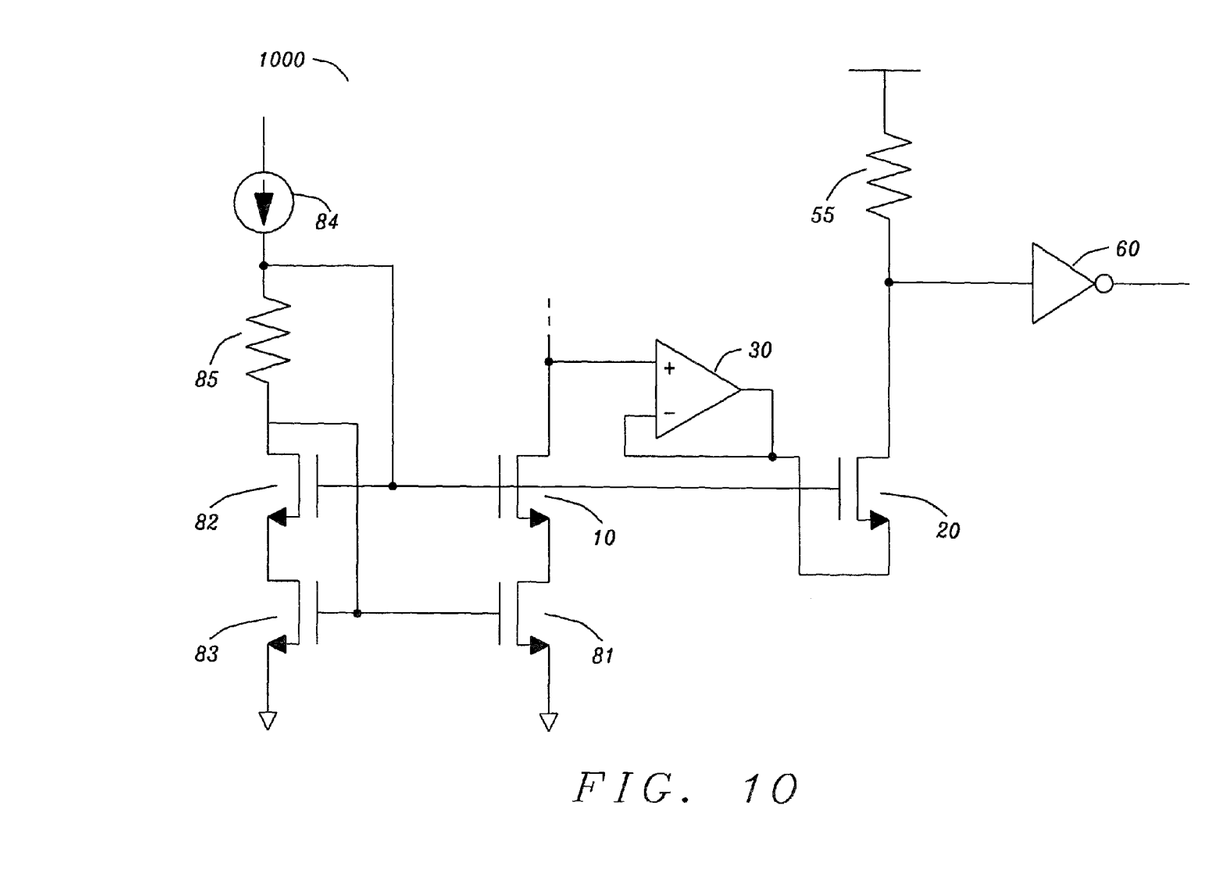
FIG. 10 schematically illustrates an application example of a circuit for detecting whether a transistor device is in saturation mode according to embodiments of the disclosure.

In a cascode-based current source as illustrated in FIG. 10, the precision depends on whether or not the cascode device 10 (first transistor device) is in saturation. When the cascode device is in the linear region, both the output resistance and the precision drop. In such case, the overall current output of the cascode-based current source may change, which may not be acceptable, depending on specific requirements. Thus, having information on the status (i.e. operation mode) of the cascode devices (e.g. the first cascode device 10) may be crucial for appropriately operating the cascode-based current source. This information may be inferred using the circuit 1000, which may comprise, in addition to the second transistor device 20 and the buffer amplifier 30 described above, the resistance element 55 and the inverter 60 described above. Notably, the circuit 1000 is understood to be not limited to comprising the resistance element 55 and the inverter 60, and also other implementations of the current detection circuitry may be employed.

Another application example of circuits (saturation detectors) according to embodiments of the disclosure relates to a LED driver circuit for driving multiple LED strings. In such LED driver circuit, there may be multiple LDOs (one for each LED string), and a head voltage may be maintained at a level just high enough to drive the weakest LED string at the nominal current. For the other LED strings, the current may be increased to bring down the respective LDO voltage such that the transistor of the respective LDO operates in the triode region, thereby guaranteeing that the respective LDO can regulate the current. Consequently, the LED strings different from the weakest LED string have a higher peak current than the weakest LED string. However, the average current is reduced by means of the PWM duty cycle which is based on the amount by which the LDO currents had to be increased. In this configuration, circuits (saturation detectors) according to embodiments of the disclosure may be applied to any of the LDOs, e.g. in the manner described above with reference to FIG. 10.

In general, circuits (saturation detectors) according to embodiments of the disclosure can be applied to any amplification stage, such as an audio amplification stage, for example. In such configurations, they can provide for early detection of signal distortion by detecting saturation of transistor devices within the amplification stage, without having to observe the signal distortion itself. In fact, under certain conditions, when a transistor device goes from saturation to the linear region the gain may drop, which would cause signal distortion. Since signal clipping might not occur until the amplifier goes into deep saturation, detecting the transistor device leaving saturation could give an early detection of signal distortion and appropriate counter-measures could be taken.

It should be noted that while the circuits described above are said to be suited for determining whether a first transistor device 10 is in the saturation region, the same circuits may also be employed, under certain circumstances, to determine whether the first transistor device 10 is e.g. in the linear region. Thus, in general, the circuits described above may be said to correspond to circuits for determining whether the first transistor device 10 is in a predetermined operation mode.

It should further be noted that the apparatus (circuit) features described above correspond to respective method features that may however not be explicitly described, and vice versa, for reasons of conciseness. The disclosure of the present document is considered to extend also to such method and apparatus features, respectively.

It should further be noted that the description and drawings merely illustrate the principles of the proposed apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A circuit for determining whether a first transistor device is in a predetermined operation mode, comprising:
    a second transistor device, wherein gate terminals of the first and second transistor devices are connected, and a drain terminal of the first transistor device is connected to a source terminal of the second transistor device;
    a buffer amplifier connected between the drain terminal of the first transistor device and the source terminal of the second transistor device, wherein an output of the buffer amplifier is directly connected to the source terminal of the second transistor device and an input of the buffer amplifier is supplied by the drain terminal of the first transistor device; and
    a circuitry for determining whether the first transistor device is in the predetermined operation mode based on an indication of a current flowing through the second transistor device.

2. The circuit according to claim 1, wherein the predetermined operation mode is a saturation mode.

3. The circuit according to claim 1, wherein the buffer amplifier comprises an operational amplifier with its output port connected to its inverting input port.

4. The circuit according to claim 1, further comprising a voltage source connected between the drain terminal of the first transistor device and the buffer amplifier.

5. The circuit according to claim 1, wherein the circuitry for determining whether the first transistor device is in the predetermined operation mode is adapted to compare said current flowing through the second transistor device to a reference current.

6. The circuit according to claim 5, wherein the circuitry for determining whether the first transistor device is in the predetermined operation mode comprises a current source for generating the reference current connected in series with the second transistor device and an inverter connected to an intermediate node between the second transistor device and the current source.

7. The circuit according to claim 5, wherein the circuitry for determining whether the first transistor device is in the predetermined operation mode comprises a resistance element connected in series with the second transistor device and an inverter connected to an intermediate node between the second transistor device and the resistance element.

8. The method according to claim 1, wherein said determining involves comparing said current flowing through the second transistor device to a reference current.

9. A method of determining whether a first transistor device is in a predetermined operation mode, the method comprising:
    sensing a voltage at a drain terminal of the first transistor device;
    supplying said sensed voltage to a buffer amplifier as an input of the buffer amplifier;
    supplying an output of the buffer amplifier to a source terminal of a second transistor device, wherein the output of the buffer amplifier is directly connected to the source terminal of the second transistor device, and wherein gate terminals of the first and second transistor devices are connected; and
    determining whether the first transistor device is in the predetermined operation mode based on an indication of a current flowing through the second transistor device.

10. The method according to claim 9, wherein the predetermined operation mode is a saturation mode.

11. The method according to claim 9, wherein the buffer amplifier comprises an operational amplifier with its output port connected to its inverting input port.

12. The method according to claim 9, further comprising adding an offset voltage to said sensed voltage.

* * * * *